Figure 1A:
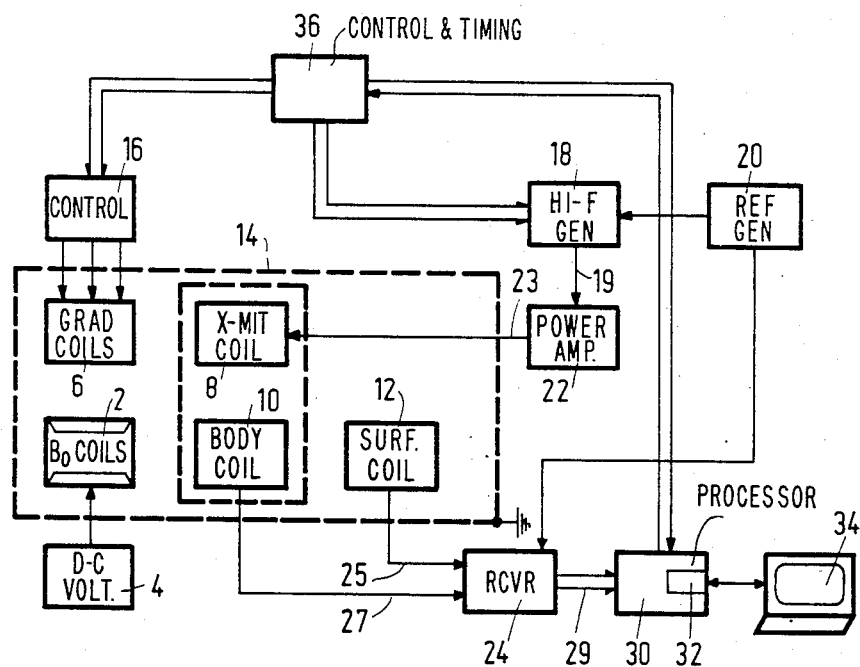

United States Patent [19]

Fuderer et al.

[11] Patent Number: 4,812,753
[45] Date of Patent: Mar. 14, 1989

[54] METHOD AND ARRANGEMENT FOR DETERMINING A CORRECTED MRI SURFACE COIL IMAGE

[75] Inventors: Miha Fuderer; Johannes J. M. Cuppen, Both of Eindhoven, Netherlands

[73] Assignee: U.S. Philips Corp., New York, N.Y.

[21] Appl. No.: 117,121

[22] Filed: Nov. 4, 1987

[30] Foreign Application Priority Data

Nov. 7, 1986 [NE] Niger ................... 8602821

[51] Int. Cl.⁴ ............................................. G01R 33/20
[52] U.S. Cl. .................................... 324/307; 324/318
[58] Field of Search ............... 324/300, 307, 308, 309, 324/311, 312, 313, 318, 322; 128/653

[56] References Cited

U.S. PATENT DOCUMENTS

| | | | |
|---|---|---|---|
| 4,477,777 | 10/1984 | Gordon | 324/307 |
| 4,480,228 | 10/1984 | Bottomley | 324/309 |
| 4,486,709 | 12/1984 | Bendall | 324/314 |
| 4,718,431 | 1/1988 | Hartl et al. | 324/308 |
| 4,731,865 | 3/1988 | Sievenpiper | 324/307 |

FOREIGN PATENT DOCUMENTS

| | | |
|---|---|---|
| 0187389 | 7/1986 | European Pat. Off. |
| 60376 | 5/1985 | Japan |
| 6061666 | 9/1985 | Japan |
| 61 148358 | 7/1986 | Japan |

OTHER PUBLICATIONS

C. E. Hayes, "Noise Performance of Surface Coils for Magnetic Resonance Imaging at 1.5 T", Sep.-Oct. 1985, pp. 604-607, Am. Assoc. Med., vol. 12, no. 5.

Primary Examiner—Michael J. Tokar
Attorney, Agent, or Firm—Jack D. Slobod

[57] ABSTRACT

In MRI (Magnetic Resonance Imaging), the signal-to-noise ratio with nuclear magnetic resonance signals received by a surface coil from an excited body is considerably larger than with corresponding signals received by a body coil in the relevant region. The sensitivity pattern of a surface coil is very non-uniform, however. By correction of a reconstructed image from MR signals received by a surface coil by a corresponding image from MR signals received by a body coil, in which event the surface coil has an arbitrary shape and occupies an arbitrary position with respect to the body, the non-uniformity in the surface coil image is brought back to the uniformity of the body coil image.

17 Claims, 2 Drawing Sheets

METHOD AND ARRANGEMENT FOR DETERMINING A CORRECTED MRI SURFACE COIL IMAGE

The invention relates to a method of determining a nuclear magnetization distribution in a part of a body in which resonance signals are produced, in which detection of a first group of resonance signals takes place with the use of a surface coil and detection of a second group of resonance signals takes place with the use of a surface coil and detection of a second group of resonance signals takes place with the use of a body coil.

The invention further relates to an arrangement for determining a nuclear magnetization distribution in a part of a body, this arrangement comprising a surface coil for detection of a first group of resonance signals, reconstruction means for at least the first group of resonance signals and processing means for determining the nuclear magnetization distribution from the first group of resonance signals and further comprising a body coil for detection of a second group of resonance signals and reconstruction means for the second group of resonance signals.

As reception coils for detection of resonance signals with MRI (Magnetic Resonance Imaging) of, for example, a patient, both body coils (i.e. reception coils enclosing the whole body of the patient or also reception coils enclosing, for example, the whole head) and surface coils (i.e. local coils used for imaging given parts of the body, such as, for example, the eyes, knee-joints, neck and parts of the back-bone), are used.

European Patent Specification EP 0 187 389 discloses an arrangement in which a method is carried out, in which magnetic resonance signals produced in a part of a body are detected by means of both a body coil and a surface coil, while there is switched, in order to obtain an image from resonance signals in a receiver detecting resonance signals, between the resonance signals of the body coil and the resonance signals of the surface coil so as to obtain a global image and a local image, respectively, of a given part of the body. Besides the said possibility of selectively utilizing resonance signals produced in the body coil and in the surface coil, respectively, resonance signals produced both in the body coil and in the surface coil may also be passed on to the receiver to increase the signal-to-noise ratio of the signal from which further an image is reconstructed.

A disadvantage is that in the case in which the resonance signals originate from a surface coil, an image reconstructed from the resonance signals exhibits a great difference in intensity of image values, for example originating from excited spins near the surface coil, and of image values originating, for example, from excited spins at a larger distance from the surface coil, due to the fact that the sensitivity of the surface coil is distributed non-uniformly over a body to be measured. An image reconstructed from resonance signals of a body coil substantially does not exhibit this effect because of the fact that the body coil has a very uniform sensitivity with respect to a body to be measured.

The invention has for its object to provide a method and an arrangement in which an image originating from resonance signals of a surface coil substantially does not exhibit any longer intensity differences due to a non-uniform sensitivity of the surface coil.

A method according to the invention is for this purpose characterized in that with information obtained from the second group of resonance signals a correction is carried out on data derived from the first group of resonance signals.

An arrangement according to the invention is for this purpose characterized in that the processing means comprise programmed means for carrying out with information obtained from the second group of resonance signals a correction on data derived from the first group of resonance signals.

The fact is utilized that the surface coil, which has the disadvantage of a non-homogeneous sensitivity over the relevant region, has with respect to the body coil the advantage of a generally considerably larger signal-to-noise ratio than the body coil, while also the fact is utilized that the body coil, which has the disadvantage of the smaller signal-to-noise ratio, has with respect to the surface coil the advantage of a substantially homogeneous sensitivity over the relevant region. The correction utilizes the advantages of body and surface coil by using information from resonance signals both of a body coil image and of a surface coil image, it not being necessary for the surface coil to have a predetermined shape and to occupy a predetermined position with respect to a patient to be examined. It should be stated here that in case the surface coil has a predetermined shape and occupies a predetermined position with respect to the patient, the correction of the non-uniformity of the surface coil takes place without problems because a correction then utilizes an a priori known non-uniform shape of the coil and the sensitivity can thus be made uniform by dividing image values of a value obtained from the resonance signals by associated values from this shape. This is known per se from SMRM 4 (1985), p. 206. However, the invention is not based on this assumption and a flexible positioning or even the use of a flexible coil must be possible, while a priori knowledge is not used for non-uniformity correction.

An embodiment of a method according to the invention is characterized in that the correction takes place after reconstruction of a surface coil image and a body coil image from the first and second group of resonance signals, respectively. Before the correction is carried out, first images are reconstructed from the resonance signals originating from the body coil and the surface coil, preferably by means of a multi-dimensional Fourier transformation.

A further embodiment of a method according to the invention is characterized in that an image value at a location of the surface coil image is corrected by a first position-dependent correction factor, which is determined from image values of this location and the direct environment thereof in the surface coil image and corresponding image values of the body coil image. When per image element a correction factor is determined which utilizes image elements of the body coil image and image elements of the surface coil image associated with said image point and further image point information in the direct environment of these image points and when the surface coil image is corrected by this correction factor, the non-uniformity of the surface coil is brought substantially to the uniformity of the body coil image.

A further embodiment of a method according to the invention is characterized in that the first correction factor is determined from the quotient of the weighted average local surface coil image values and corresponding weighted average local body coil image values. The quotient of weighted average local values from body coil image and surface coil image is in fact determined in that the non-uniformity variation per image element is estimated from both images. When a weighted average value is chosen, this leads to more satisfactory results than when, for example, an arithmetical average value is chosen. By a suitable choice of weighting in the estimation, a larger weight is assigned to image elements in the direct proximity of the relevant local image element than to also weighted image points, which are further remote from the local image point.

A further embodiment of a method according to the invention is characterized in that the first correction factor is determined from the quotient of the sum of weighted average local surface coil image values plus a constant and from the sum of corresponding weighted average local body coil image values plus the constant. When to the sums of weighted average local image values in the numerator and the denominator a constant is added which is, for example, four times the standard deviation from the weighted average local surface coil image values that should originate from that part of the image in which no body is present, it is achieved that in regions in which both the weighted average local body coil image value and the weighted average local surface coil image value are very small with respect to the constant, the correction factor becomes substantially equal to unity. Thus, it is achieved that the background in the image is not emphasized by the correction, which would definitely be the case without the use of the constant.

A further embodiment of a method according to the invention is characterized in that a corrected image value is determined from the quotient of the local surface coil image value to be corrected and the first correction factor. Thus, it is achieved that each image value in the surface coil image is corrected. It should be stated here that the imaging method is not essential in this case; any known method may be used. However, equivalent pulse sequences are preferably used to obtain the images, the resolution of the iamges not necessarily being equal.

A further embodiment of a method according to the invention is characterized in that a local image value of a corrected image is formed from a combination of the local surface coil image value and the corresponding local body coil image value. Thus, it is achieved that in given regions in the image, in which the sensitivity of the surface coil is so low that the signal-to-noise ratio of the body coil has the same order of magnitude as the signal-to-noise ratio of the surface coil, the respective image values are emphasized in dependence upon their signal-to-noise ratio in these regions in the corrected image by choosing a combination of local image values of the coils. In the extreme case in which the signal-to-noise ratio of the body coil is considerably larger than the signal-to-noise ratio of the surface coil, the corrected image value of the surface coil image becomes equal to the local image value of the body coil.

A further embodiment of a method according to the invention is characterized in that the local image value of the corrected image is formed from the product of the first correction factor and the local surface coil image value summated with the product of the square value of a second correction factor and the corresponding local body coil image value, this sum being divided by the sum of the square value of the second correction factor and the square value of the first correction factor. The combination thus becomes a linear combination, as a result of which in dependence upon respective signal-to-noise ratios a smooth transition is obtained from corrected image elements according to the method with only the first correction factor to corrected image elements which are equal to associated image elements from the body coil image.

A further embodiment of a method according to the invention is characterized in that the second correction factor is formed from the quotient of the noise level of the surface coil image and of the noise level of the body coil image. By this choice of the second correction factor, a linear combination is attained, which is optimal from a view-point of a minimum amount of noise in the corrected image.

A further embodiment of a method according to the invention is characterized in that the body coil image is sensed with a considerably lower resolution than the surface coil image. Thus, it is achieved that the overall measuring and processing time is shortened.

A further embodiment of a method according to the invention is characterized in that the first correction factor is determined from local image values of the body coil image measured with lower resolution and from local image values of an additional surface coil image which is sensed with a considerably lower resolution than the corrected surface coil image. Thus, it is achieved that the overall measuring and processing time is even further shortened. It is then advantageous to use, for example, for the images sensed with comparatively low resolution, for example, FFE (fast field echo) methods; FFE is a spin warp method with a small pulse angle.

A further embodiment of a method according to the invention is characterized in that with a previously known shape of the surface coil the correction takes place by correcting image values at locations of the surface coil image by third correction factors, which are determined from predetermined values following from pattern recognition, which utilizes the surface coil image and the body coil image. Thus, it is achieved that with a previously known shape of the surface coil, but with an orientation of the coil not previously known, nevertheless a priori knowledge of the coil is used as far as possible.

A further arrangement according to the invention is provided with storage means for storing a surface coil image obtained from the first group of resonance signals and is further provided with storage means for storing a body coil image obtained from the second group of resonance signals, characterized in that further programmed means are provided for determining first correction factors formed from quotients of corresponding weighted average image values from the surface coil image and from the body coil image and for the correction of the surface coil image by the calculated first correction factors.

A further arrangement according to the invention is provided with storage means for storing a surface coil image obtained from the first group of resonance signals and is further provided with storage means for storing a body coil image obtained from the second group of resonance signals, characterized in that further programmed means are provided for determining first correction factors formed from the quotients of sums of weighted average image values from the surface coil image plus a constant and of sums of corresponding weighted average image values from the body coil image plus the constant.

A further arrangement according to the invention is provided with storage means for storing a surface coil image obtained from the first group of resonance signals and is further provided with storage means for storing a body coil image obtained from the second group of resonance signals, characterized in that further programmed means are provided for calculating a corrected image from a combination of surface coil image values and corresponding body coil image values.

A further arrangement according to the invention is characterized in that further programmed means are provided for determining first correction factors formed from quotients of corresponding average image values from the surface coil image and from the body coil image, for determining a second correction factor formed from the quotient of a noise level of a surface coil image and a noise level from the body coil image, the noise levels being determined from a region in which no body is present, and for calculating the corrected image from weighted sums of surface coil image values and body coil image values with the first and second correction factors as weighting factors.

It should further be noted that correction of the surface coil image with the use of the body coil image need not be limited to a non-uniformity correction. Correction of, for example, phase errors caused by the surface coil is also a possibility.

Figure 1B:
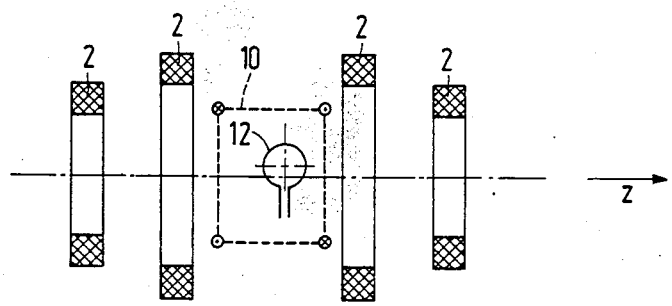
Figure 2A:
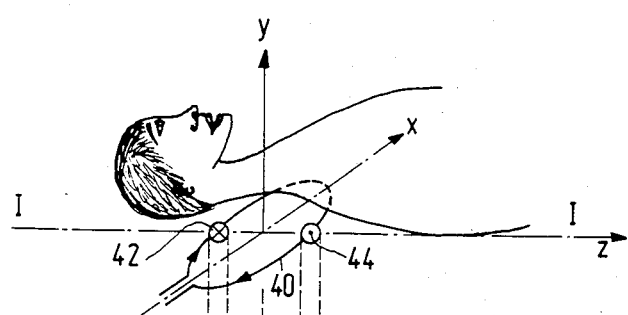
Figure 2B:
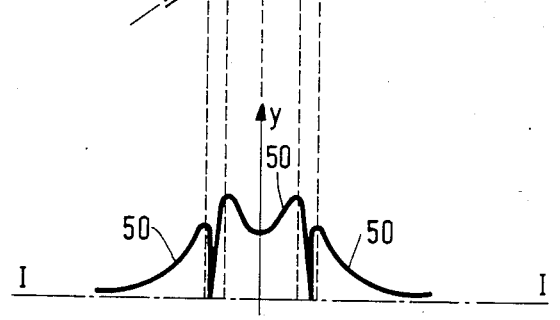
Figure 3A:
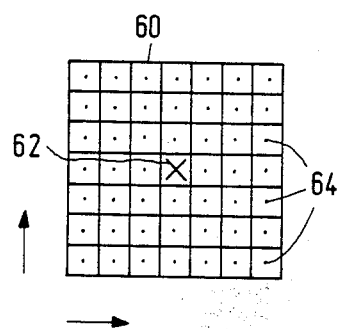
Figure 3B:
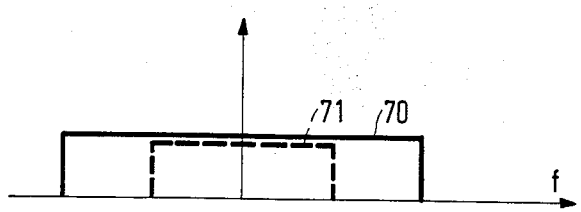

The invention will be described more fully with reference to embodiments shown in a drawing, in which:

FIG. 1a is a diagrammatic representation of an arrangement according to the invention, FIG. 1b shows diagrammatically in a sectional view coils for the stationary field and reception coils, FIG. 2a shows a circular surface coil with respect to a patient to be examined, FIG. 2b shows in a sectional view I-I a sensitivity curve of the circular coil, FIG. 3a shows diagrammatically the location of a local image element with respect to image points in the immediate proximity thereof, FIG. 3b shows frequency contents for images sensed with a comparatively low and a comparatively high resolution, respectively.

FIG. 1a shows diagrammatically an arrangement according to the invention, which comprises magnet coils 2 fed by a direct voltage supply 4 to produce a uniform stationary magnetic field $B_O$, gradient coils 6, a transmitter coil 8 for excitation of nuclear magnetic resonance signals, a body coil 10 for measuring MR signals and a surface coil 12 also for measuring MR signals. Preferably, the coils are situated within a screening 14. The gradient coils 6, which are driven by a gradient coil control device 16, serve to produce magnet field gradients. The arrangement further comprises a high-frequency generator 18, which is driven by a reference generator 20. The signal 19 produced by the high-frequency generator 18 is amplified by a high-frequency power amplifier 22. The transmitter coil 8 is energized by the output signal 23 of the highfrequency power amplifier 22. When a patient to be examined is present in the arrangement and inter alia the transmitter coil 8 is energized, MR signals will be produced thereby in the patient. The MR signals 25 and 27 received by the body coil 10 and the surface coil 12 are detected in the receiver 24. The data acquisition and processing unit 30 (a computer system comprising analog and digital interface units serves for data acquisition and processing. The data acquisition takes place after signal sampling of the detected signals 29 in the unit 30, which also provides for further data processing to obtain MR images and comprises storage means 32 for storing MR signals 25 and 27 reconstructed to image. The display unit 34 serves inter alia to display the images obtained. The control and timing unit 36, which has a bi-directional connection with the data acquisition and processing unit 30, serves to switch the gradient coil control device 16 and the high-frequency generator 18 according to a predetermined program.

In FIG. 1b, the magnet coils 2 and the body coil 10 are shown in sectional view, while the surface coil 12 is also indicated therein. By way of example, the surface coil 12 is indicated as a circular surface coil, but any shape is allowed. The shape of the surface coil may be chosen, for example, so that the coil corresponds as far as possible to the shape of a part of a body of which an MR image should be produced. The body coil 10 and the surface coil 12 both serve for the reception of MR signals.

Before the remaining Figures will be described, it should be stated that two important parameters in reception coils are the Q factor and the filling factor. The Q factor of a coil in series resonance with a capacitor as defined as $\omega_O L/R$, where $\omega_O$ is the resonance angular frequency of the resonant circuit, L is the self-induction coefficient of the coil and R is the ohmic loss resistance of the coil. The filling factor is the quotient of a volume from which a signal is received and of that part of the volume which is coupled to the coil. The smaller a coil, the larger is the filling factor. Surface coils have a considerably larger filling factor and supply a larger resonance signal originating from a given quantity of excited spins than a resonance signal originating from the same quantity of excited spins received by a body coil. Thus, the signal-tonoise ratio of the surface coil is generally more satisfactory. The Q factor of a coil decreases considerably when a patient is present in or near the coil. In a large number of cases, it is efficacious to measure resonance signals by means of a surface coil and to reconstruct an image from these resonance signals.

FIG. 2a shows a circular surface coil 40 with respect to a patient to be examined, an axis I—I being indicated through conductors 42 and 44 of the coil 40 shown in sectional view and an axis y being indicated at right angles to the plane in which the coil 40 is located. The patient is indicated diagrammatically with respect to an x-y-z orthonormal coordinate system.

FIG. 2b shows a sensitivity curve 50 of the coil in the sectional view I—I at right angles to the plane of the coil. The unit along the coil I—I is a distance measure and the sensitivity of the coil is plotted along the axis y in this sectional view against the distance measure. FIG. 2b clearly shows that the sensitivity varies non-uniformly with the distance. The non-uniform sensitivity of the surface coil becomes manifest in an image reconstructed from resonance signals 25, which are sensed by the surface coil 12, the reconstruction being effected by reconstruction means which are present in the unit 30. The reconstruction through, for example, a multidimensional Fourier transformation on the sampled resonance signals takes place by means of programmed means which are also present in the unit 30. The image shows in grey values the nuclear magnetization distribution in a part of a body in which MR signals are produced. At areas having a comparatively low sensitivity, a comparatively small signal is received in the presence of a patient. Because of the dynamic range in the sensitivity curve 50, signals originating from areas having a comparatively low sensitivity, but having nevertheless a comparatively large number of excited spins, become manifest, for example as dark regions, in the image as if there were a comparatively small number of excited spins.

An embodiment of a method according to the invention is now described in which programmed means in the unit 30 are provided, which utilize an image reconstructed from resonance signals which are sensed by the body coil 10 to correct an image reconstructed from resonance signals sensed by the surface coil 12 in such a manner that the non-uniformity of the surface coil 12 is practically brought back to the uniformity of the body coil 10. For this purpose, a non-uniformity pattern in the surface coil image is estimated from the body coil image and the surface coil image. By correction of the surface coil image with the non-uniformity pattern, a corrected image is obtained having the uniformity of the body coil and the signal-to-noise ratio of the surface coil. In the non-uniformity pattern of the image sensed by the surface coil—of arbitrary type and dimension and in an arbitrary position with respect to a patient to be examined—a first correction factor F is associated with each corresponding local image element. A corrected image is determined by dividing each image element in the surface coil image by the associated F from the non-uniformity pattern:

$$SC_c = SC/F \qquad (1)$$

where
SC is the value of a local image element,
F is the associated first correction factor and
SC is the corrected value of the local image element.
Each F is an estimator from a local surface coil image value, a corresponding local body coil image value and values of image elements from the intimate proximity of the local image elements. F is determined from:

$$F = \widehat{SC}/\widehat{BC} \qquad (2)$$

where
$\widehat{SC}$ is the smoothed value of the local image value SC and
$\widehat{BC}$ is the smoothed value of the local image value BC.

This "smoothing" process is now explained more fully.

FIG. 3a shows diagrammatically a bidimensional raster of 7×7 image elements 60, in which reference numeral 62 designates the local image element and the 48 remaining image elements 64 are the image elements in the immediate proximity thereof. According to the "smoothing" method used, four uniform smoothing operations are carried out. First, for example, a uniform 7×7 "smoothing" is carried out, which means that each image point in an image is replaced by an arithmetical average value of an environment of 49 image points, in which the local image element to be processed is centrally arranged, as indicated in FIG. 3a. In a similar manner, a 9×9 smoothing, an 11×11 smoothing and a 13×13 smoothing are carried out successively. The order of succession of these four smoothing operations may also be different. It can be demonstrated in a simple manner that the effect of these four smoothing operations is equal to the effect of a weighted determination of the average of a square of 37×37 image elements. When weighted average values are used, the values of the image elements located relatively close to the local image element will have a larger weight than the image elements at a relatively larger distance.

A preferred embodiment of a method according to the invention will now be described, in which it is avoided that the noise in regions which do not supply an MR signal contribution, but nevertheless belong to the image, is unnecessarily amplified. For this purpose, an improved F is defined with respect to the embodiment already described:

$$F = (\widehat{SC} + \delta)/(\widehat{BC} + \delta) \qquad (3)$$

where $\delta$ is a small number. $\delta$ is, for example four times the standard deviation on $\widehat{BC}$ as far as $\widehat{BC}$ originated from that part of the image in which no body is present. In those regions in which $\widehat{BC}$ and $\widehat{SC}$ are very small ($<\delta$), F becomes approximately equal to unity. As a result, noise is not unnecessarily amplified in these regions.

A further preferred embodiment of a method according to the invention will now be described. In given regions, in which the sensitivity of the surface coil is so low that the signal-to-noise ratio of the body coil is larger than the signal-to-noise ratio of the surface coil, besides the corrector factors F and the local image values SC also a second correction factor $r^2$ and the local image values BC participate in the correction, as a result of which a combination of corrections is obtained:

$$SC_c = (F \times SC + r^2 \times BC)/(F^2 + r^2) \qquad (4)$$

where r is: the noise level of the surface coil image divided by the noise level of the body coil image. As a result, it is achieved for regions having a low sensitivity of the surface coil that $SC_c \approx BC$, while the image element is estimated practically completely by the body coil. It can be demonstrated in a simple manner that the choice of $r^2$ as the second correction factor is optimal with respect to minimization of the noise in the corrected image. Another power of r causes also $SC_c$ to become $\approx$ BC for low sensitivity of the surface coil, but is not optimal from a view-point of noise. It will be indicated hereinafter how the second correction factor $r^2$ is determined. The regions of the image which image "the air" always have a lower variance than the regions in which the body of a patient to be examined is present (noise with respect to noise with signal). Moreover, it can be assumed that a number of image values of image elements from at least one of the four angular points of the image originates only from noise. The variance of each of the four angular points is determined from a number of image elements in the immediate proximity of the angular point (for example 20×20 image elements). From the four variances thus obtained, the smallest is chosen. It is assumed that only noise is present in the angular point having the smallest variance. In this angular point, r is estimated:

$$r = \sqrt{v_{SC}/v_{BC}} \qquad (5)$$

where $v_{SC}$ is the variance in this angular point and
$v_{BC}$ is the variance in the corresponding angular point of the body coil image.

A particular embodiment of a method according to the invention will now be described. The first correction factor is formed from weighted average image values of the body coil image and the surface coil image, after which only local surface coil image values are used to determine the corrected image, while the local body coil image values do not play a part therein any longer. When forming the factors F, use is consequently made of average image values, while without too much difficulty the body coil image of lower resolution can be sensed, as a result of which a smaller number of sequences is required to form an image therefrom so that time is saved. The lower resolution is attained, for example, in one dimension of the image by taking larger steps in a preparation gradient $G_y$ serving to code in phase an image in one dimension with a Fourier imaging method, such as, for example, described in the said article by Hinshaw and Lent. After the resonance signals for the image of lower resolution have been sensed, "smoothing" takes place in a manner as indicated above. FIG. 3b shows diagrammatically the frequency content of images of comparatively low and comparatively high resolution. The frequency content is plotted against the frequency. The frequency content 70 holds for the image sensed with comparatively high resolution and the frequency content 71 holds for the image sensed with comparatively low resolution. Different filters are used to give both parts a substantially equal frequency content. In practice, the filtering operation is carried out, for example, by convolution in the inverse Fourier range of the frequency range.

A further particular embodiment will now be described. An additional surface coil image also of low resolution is measured. The non-uniformity is calculated from two images of low resolution. In only a few seconds, the non-uniformity is estimated with the use of, for example, the FFE (Fast Field Echo) method. The surface coil image sensed with high resolution is then corrected by means of the non-uniformity determined.

A particular embodiment will now be described. Use is made in this case of a priori knowledge of a surface coil, which knowledge is stored in the storage means 32 of the unit 30. If it is known before the measurement, which surface coil is used, and if data of the coil are known about the sensitivity based on theoretical calculations or from a previously measured diagram in a given orientation, the data can be stored in the storage means 32. In a given orientation of the surface coil 12, a pattern recognition is carried out on the data measured by the surface coil and by the body coil. The most accurately corresponding sensitivity pattern is used to characterize the sensitivity of the coil in an arbitrary orientation and thus to correct the non-uniformity of the surface coil. Standardization of the surface coil image takes place in the manner as already described.

What is claimed is:

1. A method of determining a nuclear magnetization distribution in a part of a body in which resonance signals are produced, in which detection of a first group of resonance signals takes place with the use of a surface coil and detection of a second group of resonance signals takes place with the use of a body coil, characterized in that a correction is carried out by information obtained from the second group of resonance signals on data derived from the first group of resonance signals.

2. A method as claimed in claim 1, characterized in that the correction takes place after reconstruction of a surface coil image and a body coil image, respectively, from the first and the second group of resonance signals, respectively.

3. A method as claimed in claim 2, characterized in that an image value at a location of the surface coil image is corrected by a first position-dependent correction factor, which is determined from image values of this calculation and the immediate proximity thereof in the surface coil image and corresponding image values of the body coil image.

4. A method as claimed in claim 3, characterized in that the first correction factor is determined from the quotient of weighted average local surface coil image values and corresponding weighted average local body coil images.

5. A method as claimed in claim 3, characterized in that the first correction factor is determined from the quotient of the sum of weighted average local surface coil image values plus a constant and of the sum of corresponding weighted average local body coil image values plus the constant.

6. A method as claimed in claim 3, 4 or 5, characterized in that a corrected image value is determined from the quotient of the local surface coil image values to be corrected and the first correction factor.

7. A method as claimed in claim 3, 4 or 5, characterized in that a local image value of a corrected image is formed from a combination of the local surface coil image value and the corresponding local body coil image value.

8. A method as claimed in claim 7, characterized in that the local image value of the corrected image is formed from the product of the first correction factor and the local surface coil image value summated with the product of the square value of a second correction factor and the corresponding local body coil image value, this sum being divided by the sum of the square value of the second correction factor and the square value of the first correction factor.

9. A method as claimed in claim 8, characterized in that the second correction factor is formed from the quotient of the noise level of the surface coil image and of the noise level of the body coil image.

10. A method as claimed in any one of claims 2, 3, 4 or 5, characterized in that the body coil image is sensed with a considerably lower resolution than the surface coil image.

11. A method as claimed in any one of claims 3, 4 or 5, characterized in that the first correction factor is determined from local image values of the body coil image measured with lower resolution than the surface coil image and local image values of an additional surface coil image, which is sensed with a considerably lower resolution than the corrected surface coil image.

12. A method as claimed in claim 2, characterized in that with a previously known shape of the surface coil the correction takes place by correction of image values at locations of the surface coil image by third correction factors, which are determined from predetermined values following from pattern recognition, which utilizes the surface coil image and the body coil image.

13. An arrangement for determing a nuclear magnetization distribution in a part of a body, this arrangement comprising a surface coil for detection of a first group of resonance signals, reconstruction means for at least the first group of resonance signals and processing means for determining the nuclear magnetization distribution from the first group of resonance signals and further comprising a body coil for detection of a second group of resonance signals and reconstruction means for the second group of resonance signals, characterized in that the processing means comprise programmed means for carrying out a correction by means of information obtained from the second group of resonance signals on data derived from the first group of resonance signals.

14. An arrangement as claimed in claim 13, provided with storage means for storing a surface coil image obtained from the first group of resonance signals and further provided with storage means for storing a body coil image obtained from the second group of resonance signals, characterized in that further programmed means are provided for determining first correction factors formed from quotients of corresponding weighted average image values from the surface coil image and from the body coil image, and for the correction of the surface coil image by the known first correction factors.

15. An arrangement as claimed in claim 13, provided with storage means for storing a surface coil image obtained from the first group of resonance signals and further provided with storage means for storing a body coil image obtained from the second group of resonance signals, characterized in that further pogrammed means are provided for determing first correction factors formed from quotients of sums of weighted average image values from the surface coil image plus a constant and of sums of corresponding weighted average image values from the body coil image plus the constant.

16. An arrangement as claimed in claim 13, provided with storage means for storing a surface coil image obtained from the first group of resonance signals and further provided with storage means for storing a body coil image obtained from the second group of resonance signals, characterized in that further programmed means are provided for calculating a corrected image from a combination of surface coil image values and corresponding body coil image values.

17. An arrangement as claimed in claim 16, characterized in that further programmed means are provided for determining first correction factors formed from quotients of corresponding average image values from the surface coil image and from the body coil image, for determining a second corrector factor formed from the quotient of a noise level from the surface coil image and a noise level from the body coil image, the noise levels being determined from a region in which no body is present, and for calculating the corrected image from weighted sums of surface coil image values and body coil image values with the first and second correction factors as weighting factors.

* * * * *